United States Patent [19]

Oftring et al.

[11] Patent Number: 4,954,369
[45] Date of Patent: Sep. 4, 1990

[54] CHEMICAL DEPOSITION OF COPPER FROM ALKALINE AQUEOUS BATHS

[75] Inventors: Alfred Oftring; Chung-Ji Tschang, both of Bad Duerkheim; Ekhard Winkler, Mutterstadt; Guenther Gotsmann, Frankenthal; Klaus Glaser, Mutterstadt, all of Fed. Rep. of Germany

[73] Assignee: BASF Aktiengesellschaft, Ludwigshafen, Fed. Rep. of Germany

[21] Appl. No.: 312,926

[22] Filed: Feb. 21, 1989

[30] Foreign Application Priority Data

Feb. 27, 1988 [DE] Fed. Rep. of Germany ....... 3806306

[51] Int. Cl.$^5$ .............................................. C23C 26/00
[52] U.S. Cl. ............................... 427/430.1; 427/443.1
[58] Field of Search ........................... 427/430.1, 443.1

[56] References Cited

U.S. PATENT DOCUMENTS 4,503,131  5/1985  Baudrand et al. .
4,816,553  3/1989  Baur ...................... 528/245

FOREIGN PATENT DOCUMENTS 170932   10/1982  Japan .................................. 427/430.1
0005336  1/1983   Japan .................................. 427/430.1
29834    2/1983   Japan .................................. 427/430.1
2109013  5/1983   United Kingdom .

*Primary Examiner*—Shrive Beck
*Assistant Examiner*—Vi Duong Dang
*Attorney, Agent, or Firm*—Oblon, Spivak, McClelland, Maier & Neustadt

[57] ABSTRACT

Copper is chemically deposited from alkaline aqueous baths containing polyacetal complexing agents obtainable by reacting (a) dialdehydes of the formula $$OHC-A_n-CHO,$$

where A is $-CH_2-$, $-CH_2-CH_2-$, $-CH_2-CH_2-CH_2-$, 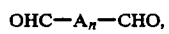

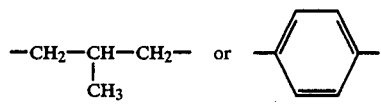

and n is 0 or 1, with (b) polyolcarboxylic acids which contain 2 or more OH groups and have from 4 to 7 carbon atoms in a molar ratio of (a):(b) of from 1:0.5 to 1:3.

3 Claims, No Drawings

CHEMICAL DEPOSITION OF COPPER FROM ALKALINE AQUEOUS BATHS

The present invention relates to the use of polyacetals from dialdehydes and polyolcarboxylic acids as complexing agents in baths for the chemical deposition of copper and to a process for the chemical deposition of copper.

The chemical, i.e. electroless, deposition of copper finds utility in the coppering of metallic objects which, for example owing to their shape, are not suitable for electroplating, and in the coppering of nonmetallic objects. In the latter case, the surface must be activated prior to coppering. This can be effected for example by means of a palladium or copper colloid. The details of the pretreatment of nonmetallic surfaces prior to the chemical deposition of copper are known to those skilled in the art and therefore require no further elucidation.

One of the most important applications of chemical coppering is the plating through of circuitboards, i.e. the deposition of copper in the holes, to make possible electrical contact between the conducting paths on both sides of the (bilayer) board. An overview of the production of circuitboards which also deals with the electrodeposition of copper is given for example in the book, Einführung in die Leiterplattentechnologie (M. Hummel, Eugen Leuze Verlag, D-7968 Saulgau, 1985).

Chemical coppering baths are aqueous solutions which customarily contain a copper salt, formaldehyde, an alkali metal hydroxide and one or more complexing agents with or without further assistants. Whereas the copper salt, the formaldehyde and the alkali metal hydroxide are those agents which drive the reductive deposition, the complexing agent has the task to prevent the precipitation of copper hydroxide and to reduce the concentration of free copper ions to such an extent as to avoid any unintentional, wild precipitation of copper. In addition, there may be added to the bath for example stabilizers in amounts of from one to a few mg/l. Such stabilizers are for example sodium cyanide, allylthiourea and 2,2′-dipyridylamine. Further observations on this matter may be found for example in German Patent 3,622,090.

Numerous complexing agents are known for use in chemical coppering baths. They include inter alia polyimines, triethanolamine, tartaric acid, gluconic acid, glucoheptonic acid, various amino acids, nitrilotriacetic acid and also N,N,N′,N′-tetrakis(2-hydroxypropyl)ethylenediamine and ethylenediaminetetraacetic acid (EDTA). The last two complexing agents mentioned are among those most frequently used. The stability of the copper complex influences the rate of deposition and the stability of the bath. For this reason the complexing agent must be chosen from these aspects. For instance, baths which contain tartaric acid, gluconic acid, amino acids, nitrilotriacetic acid or N,N,N′,N′-tetrakis(2-hydroxypropyl)ethylenediamine as complexing agents have a relatively low stability. By contrast, EDTA gives very stable baths. Numerous users of chemical coppering baths use mixtures of complexing agents, hoping in this way to confer the desired spectrum of properties on the bath.

As mentioned above, EDTA and N,N,N′,N′-tetrakis-(2-hydroxypropyl)ethylenediamine are among the most extensively used complexing agents for chemical coppering baths. They make it possible to cover a wide range of the spectrum of requirements. Unfortunately, these complexing agents, being insufficiently biodegradable, have proved to be environmental pollutants.

U.S. patent application Ser. No. 156,686 proposes to use as complexing agents polyacetals obtainable from dialdehydes and polyolcarboxylic acids having 3 or more OH groups and from 5 to 7 carbon atoms, describing inter alia the use of these polyacetals in detergents as builders and as grayness and encrustation inhibitors, with the biodegradability of the polyacetals representing a special advantage. Their complexing capacity with respect to iron nickel manganese, copper, calcium, magnesium and chromium ions is also mentioned.

It is an object of the present invention to provide novel complexing agents for baths for the chemical deposition of copper which are biodegradable and otherwise correspond to prior art complexing agents as regards the quality of the copper deposit and bath stability.

We have found that this object is achieved according to the invention if the complexing agents used for baths for the chemical deposition of copper are polyacetals of the type proposed in U.S. patent application Ser. No. 156,686 now U.S. Pat. No. 4,816,553.

The polyacetals to be used according to the invention are prepared by reacting
(a) dialdehydes of the formula

where A is $-CH_2-$, $-CH_2-CH_2-$, $-CH_2-CH_2-CH_2-$, $-CH_2-CH_2-CH_2-CH_2-$, $-CH_2-CH-CH_2-$ or
$\phantom{-CH_2-CH_2-CH_2-CH_2-,\ -CH_2-}CH_3$

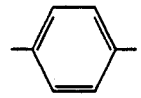

and n is 0 or 1, with (b) polyolcarboxylic acids which contain 2 or more OH groups and have from 4 to 7 carbon atoms, in a molar ratio (a):(b) of 1:from 0.5 to 3, at from 50° to 140° C. in the presence of acid catalysts and removing water from the reaction mixture during the reaction or thereafter.

These polyacetals are particularly favorable to prepare and permit the production of chemical coppering baths which admittedly do not have the extraordinary stability of those prepared with EDTA but which are more stable than those made up with N,N,N′,N′-tetrakis(2-hydroxypropyl)ethylenediamine (tradename Quadrol). It is particularly astonishing, and was unforeseeable, that the bath stability is appreciably better than with the use of gluconic acid itself. An unforeseeable advance over the prior art to the effect that novel complexing agents which are favorable to prepare, which form relatively stable complexes within existing limits and which, furthermore, are biodegradable are provided for use in chemical coppering.

The present invention accordingly provides for the use of polyacetals which are obtainable by reacting
(a) dialdehydes of the formula

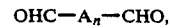

where A is $-CH_2-$, $-CH_2-CH_2-$, $-CH_2-CH_2-CH_2-$,

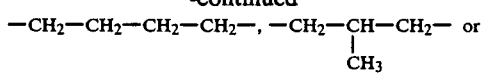

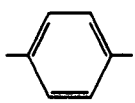

and n is 0 or 1, with (b) polyolcarboxylic acids which contain 2 or more OH groups and have from 4 to 7 carbon atoms, in a molar ratio (a):(b) of 1:from 0.5 to 3 in the presence of acidic catalysts as complexing agents in baths for the chemical deposition of copper and a process for the chemical deposition of copper where a polyacetal of the type defined above is added to the bath as a complexing agent.

Components (a) and (b) are preferably made to react with one another in a molar ratio of 1:from 0.7 to 2.5 at from 60° to 110° C. Of the polyacetals to be used according to the invention, preference is given to those which are obtained by reacting glyoxal or glutardialdehyde with gluconic acid or glucoheptonic acid. Particular preference is given to those polyacetals which are obtained on reacting glyoxal with gluconic acid in a molar ratio of from 1:0.7 to 1:2.5.

The polyacetals to be used according to the invention are added to conventional bath compositions for chemical coppering in a conventional manner, i.e. in the same concentrations as prior art complexing agents. Advantageous concentrations are amounts of from about 10 to 40 g/l of bath liquid.

These baths have the customary pH of >10.

The copper compound used is preferably crystalline copper sulfate or copper(II) chloride. The reducing agent formaldehyde is used in amounts of from 1 to 12 g/l.

Additionally, the abovementioned stabilizers and also customary surfactants may be present as assistants.

The bath temperature during coppering is in general from 15° to 50° C., preferably from 20° to 30° C. Coppering is effected over a period of from 5 to 60 minutes, preferably from 10 to 40 minutes.

A chemical coppering bath may for example have the following composition in general terms:

CuSO$_4$×5 H$_2$O: 5–20 g/l
NaOH: 12–50 g/l
Formaldehyde (based on 100%) 1–12 g/l
Complexing agent according to the invention: 10–40 g/l
Stabilizers (for example NaCN): 0.1–5 mg/l
Surfactants: 0.1–0.5 g/l
Water: to 1 l Using the invention, coppering is possible for example on: circuitboards composed of phenolic resin/paper, epoxy resin (glass fiber reinforced), ceramic, polysulfone or workpieces made of polyamide, polycarbonate, polyester, polystyrene, polyethylene, polytetrafluoroethylene or the like.

Returning to the preparation of the above-defined polyacetals to be used according to the invention, further details are as follows:

Suitable dialdehydes of component (a) are for example glyoxal, malondialdehyde, succindialdehyde, glutardialdehyde, adipindialdehyde and terephthaldialdehyde. It is also possible to use mixtures of the dialdehydes mentioned in the synthesis of polyacetals. It is also possible to use derivatives of dialdehydes which, under the synthesis conditions, decompose into the parent dialdehydes, for example open-chain acetals, such as glyoxal tetramethyl acetal, glyoxal tetraethyl acetal or glutardialdehyde tetramethyl acetal, hemiacetals, such as 2,3-dihydroxy-1,4-dioxane, and disulfates of dialdehydes, for example glyoxal disulfate. Preferably, the dialdehydes used in the synthesis of polyacetals are aqueous solutions of glyoxal or glutardialdehyde or mixtures thereof.

The polyolcarboxylic acids suitable for use as component (b) are derived from mono- or dicarboxylic acids which contain from 4 to 7 carbon atoms and 2 or more OH groups in the molecule. They comprise for example the following sugar acids: ribonic acid, lyxonic acid, mannonic acid, altronic acid, allonic acid, gluconic acid, 2-ketogluconic acid, 2,5-diketogluconic acid, gulonic acid, idonic acid, xylonic acid, talonic acid, galactonic acid, mannosaccharic acid, glucaric acid, galactaric acid, allomucic acid, glucoheptonic acid, talomucic acid, idosaccharic acid and lactones or dilactones thereof. Preferably, component (b) comprises gluconic acid and/or glucoheptonic acid.

Components (a) and (b) are made to react with one another in a molar ratio of 1:from 0.5 to 3.0, preferably in a molar ratio of 1:from 0.7 to 2.5. To ensure as complete a reaction as possible, the reaction is carried out in the presence of an acidic catalyst. It will be a strong nonvolatile acid which has a pKa of below 1. Suitable catalysts are for example p-toluenesulfonic acid, sulfuric acid, sulfamic acid, methanesulfonic acid and benzenesulfonic acid.

Suitable acidic catalysts also include ion exchangers which contain acidic groups, for example SO$_3$H or COOH groups. The catalysts are used in an amount of from 0.5 to 10, preferably from 1 to 5, % by weight, based on components (a) and (b) used in the reaction. The reaction can be carried out within a wide temperature range, for example from 25° to 140° C., preferably from 60° to 110° C. If the temperature should be above the boiling point of the particular reaction mixture used, the reaction is carried out under superatmospheric pressure, for example in an autoclave. Ordinarily the reaction is carried out under atmospheric pressure, but it may also be carried out under reduced pressure. The reaction of components (a) and (b) preferably takes place in aqueous medium at a concentration of components (a) and (b) together of from 20 to 80, preferably from 30 to 70, % by weight.

The reaction may also be carried out in the presence of an inert organic solvent in which the polyacetals are insoluble. They are then obtained in a finely divided form. Suitable inert organic solvents include not only aliphatic but also aromatic hydrocarbons, for example pentane, hexane, cyclohexane, heptane, n-octane, isooctane, nonane, decane, methylcyclohexane, benzene, toluene, o-xylene, p-xylene, m-xylene, ethylbenzene and isopropylbenzene. It is also possible to use chlorinated hydrocarbons, such as chloroform, carbon tetrachloride, methylene chloride or tetrachloroethane. The weight ratio of the amounts of inert organic solvent : water is from about 10:1 to about 1:10 and is preferably within the range from 5:1 to 1:2. The water used as solvent and the water formed in the course of the reaction of (a) with (b) is removed from the reaction mixture to prepare the polyacetals. In the course of the preparation of polyacetals from (a) and (b), from 0.5 to 3.5, preferably from 0.8 to 3.0, moles of water are formed per mole of polycarboxylic acid, i.e. component (b), and removed from the reaction mixture.

The reaction of components (a) and (b) may additionally be carried out in the presence of a water-in-oil emulsifier.

The reaction of the dialdehyde with the polyolcarboxylic acid may be carried out continuously or batchwise. It is possible for example initially to introduce a portion of an aqueous solution of a dialdehyde and a polycarboxylic acid into a reactor and convert it completely within the range of 25° to 140° C. and then to add the remainder a little at a time or batchwise and form the polyacetal therefrom. The catalyst may be for example introduced initially, or may also be metered into the reactor together with either or both reactants. The water is distilled out of the reactor during or after polyacetal formation. However, it is also possible to introduce a water-in-oil emulsion into the reactor initially and to add components (a) and (b) to the water-in-oil emulsion separately or mixed. The catalyst may even be introduced initially together with the water-in-oil emulsion or be metered into the reactor together with components (a) and (b) or alternatively separately therefrom. If an inert organic solvent or solvent mixture is used in forming the polyacetal, polyacetal formation and removal of water from the system are preferably performed simultaneously. The removal of the water takes the form of an azeotropic distillation from the reaction mixture. The polyacetals are then obtained in a finely divided form. It will be readily understood that during the reaction the components must be thoroughly mixed, for example by stirring the reaction mixture. The polyacetals obtained are soluble in water. The viscosity of 40% strength aqueous solutions at 25° C. is for example from 5 to 1,000 mPas and in some cases even more than 1,000 mPas, for example 1,800 mPas. The pure polyacetals have no defined melting point below 300° C. The IR spectra of the polyacetalcarboxylic acids show in general vibrations at 3430 $cm^{-1}$ (broad), 2930 $cm^{-1}$, 1780 $cm^{-1}$ and 1740 $cm^{-1}$ and multiple bands between 1200 and 1000 $cm^{-1}$ and also at 930 $cm^{-1}$.

I. Preparation Examples for polyacetals

EXAMPLE 1

In a flask equipped with a stirrer, a water separator and reflux condenser, 298 g (0.66 mol) of 50% strength aqueous glucoheptonic acid and 47.9 g (0.33 mol) of 40% strength aqueous glyoxal are mixed, and 6.6 g of p-toluenesulfonic acid monohydrate and 350 g of chloroform are then added. The mixture is heated with stirring to the reflux temperature. Water introduced with the starting materials and formed in the course of the reaction is distilled off azeotropically by means of the water separator. 189 g of water are distilled azeotropically out of the reaction mixture in the course of 6 hours. In the course of the reaction a precipitate forms, which, after the reaction has ended and the reaction mixture has been cooled down to room temperature, is filtered off. The precipitate is then dried at 25° C. under reduced pressure. 151 g of a solid product are obtained.

EXAMPLE 2

In the apparatus described in Example 1, 196 g (0.5 mol) of 50% strength aqueous gluconic acid, 72.6 g (0.5 mol) of 40% strength aqueous glyoxal, 9.8 g of p-toluenesulfonic acid monohydrate and 370 g of chloroform are mixed. The mixture is intensively stirred and heated at the boil for 8 hours, in the course of which a total of 155 g of water are distilled off azeotropically. The reaction mixture is then cooled down, the solid residue is allowed to settle, and the chloroform is decanted off. The residue is dried at 25° C. under reduced pressure. 115 g of polyacetal are obtained.

EXAMPLE 3

In the apparatus described in Example 1, a mixture of 235.2 g (0.6 mol) of 50% strength aqueous gluconic acid, 43.5 g (0.3 mol) of 40% strength glyoxal, 5.0 g of p-toluenesulfonic acid monohydrate and 390 g of toluene are heated to the boil with stirring. 151 g of water are distilled off azeotropically in the course of 4 hours. The reaction mixture is then cooled down, and finely divided residue is filtered off and dried under reduced pressure. 121 g of polyacetal are obtained.

EXAMPLE 4

Example 3 is repeated, except that only 34.8 g (0.24 mol) of 40% strength glyoxal are used. 146 g of water are distilled off azeotropically. 117 g of polyacetal are obtained.

EXAMPLE 5

Example 1 is repeated, except that 63.9 g (0.44 mol) of 40% strength aqueous glyoxal and 400 g of chloroform are used. 199 g of water are distilled off azeotropically. 156 g of polyacetal are obtained.

EXAMPLE 6

A flask which is equipped with a stirrer and a water separator is charged with 390 g of toluene, 11.6 g of sodium palmitinesulfonate (40% strength in water), 6.4 g of p-toluenesulfonic acid monohydrate and 192.7 g (0.5 mol) of 50.9% strength aqueous gluconic acid. The mixture is intensively stirred and heated to the boil. Immediately following the onset of boiling 200 g (0.5 mol) of 25% strength aqueous glutardialdehyde are added dropwise in the course of 1 hour. 278 g of water are distilled off azeotropically in the course of 4 hours from the onset of refluxing. The reaction mixture is then cooled down to room temperature, and the precipitate is filtered off with suction and dried at 25° C. under reduced pressure. 126 g of polyacetal are obtained.

EXAMPLE 7

Example 1 is repeated, except that the glucoheptonic acid is replaced by 100.3 g (0.33 mol) of 50% strength aqueous tartaric acid. 87 g of water are distilled off azeotropically. 59 g of polyacetal are obtained.

II. Application Examples

EXAMPLES

The use of various polyacetals as complexing agents according to the invention is demonstrated in baths for the chemical coppering of circuitboard material:

The substrates used are 15 cm long and 1 cm wide pieces of a phenolic resin/paper circuitboard (FR2) without copper laminate. The pieces of circuitboard have been incipiently etched with chromosulfuric acid and then each pretreated in temperature-controlled test tubes in a commercial chemical coppering production line in accordance with the Dynaplate manufacturing instructions (from Dr. Ing. Max Schlötter GmbH & Co. KG, 7034 Geislingen).

This pretreatment comprises the following steps: cleaning/(rinsing)/microetching/(rinsing)/predipping-/activator (Pd colloid)/(rinsing)/conditioner/(rinsing).

Following this pretreatment the pieces are subjected to chemical coppering for 10 minutes in the baths described below. They are finally rinsed with 5% strength sulfuric acid and then with water and dried with compressed air. The table below presents not only data about the compositions of the baths but also about their stability.

In every one of the examples given in the table, complete coppering of the immersed circuitboard surface is obtained. The comparative example shows that with the polyacetals according to the invention a more stable bath is obtained than with gluconic acid.

where A is $-CH_2-$, $-CH_2-CH_2-$, $-CH_2-CH_2-CH_2-$, $-CH_2-CH_2-$ $CH_2-CH_2-$, $-CH_2-CH-CH_2-$ or 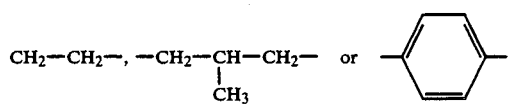
$\phantom{CH_2-CH_2-,\ -CH_2-}|$
$\phantom{CH_2-CH_2-,\ -CH_2-}CH_3$ and n is 0 or 1, with (b) a polyolcarboxylic acid which contains 2 or more OH groups and has from 4 to 7 carbon atoms, in a molar ratio of (a):(b) of 1:from 0.5 to 3 in the pres-

TABLE

| | | Baths for the chemical deposition of copper | | | | | | | | |
|---|---|---|---|---|---|---|---|---|---|---|
| | | Solution A[2] | | | | | Solution B[2] | | | |
| Applic. Ex. No. | Complexing agent | (Molar ratio) | Prep. Ex. No. | Amount [g] | NaOH [g] | $H_2O$ ad | $CuSO_4$ $5H_2O$ [g] | Formaldehyde 37% str. [g] | $H_2O$ ad | Bath temp. [°C.] | Stability[1] [h] |
| 1 | Gluconic acid/glyoxal | (1:1) | 2 | 1.2 | 1.8 | 50 ml | 0.9 | 3.7 | 50 ml | 25 | above 2 |
| 2 | Gluconic acid/glyoxal | (2:1) | 3 | 1.2 | 1.8 | 50 ml | 0.9 | 3.7 | 50 ml | 25 | above 3 |
| 3 | Gluconic acid/glyoxal | (2.5:1) | 4 | 1.2 | 1.8 | 50 ml | 0.9 | 3.7 | 50 ml | 25 | above 1 |
| 4 | Gluconic acid/glyoxal | (2:1) | 3 | 0.9 | 1.3 | 50 ml | 0.65 | 2.6 | 50 ml | 30 | above 3 |
| 5 | Glucoheptonic acid/glyoxal | (1.5:1) | 5 | 1.2 | 1.8 | 50 ml | 0.9 | 3.7 | 50 ml | 30 | above 3 |
| 6 | Glucoheptonic acid/glyoxal | (2:1) | 1 | 1.2 | 1.8 | 50 ml | 0.9 | 3.7 | 50 ml | 25 | above 2 |
| 7 | Gluconic acid/glutardialdehyde | (1:1) | 6 | 1.2 | 1.8 | 50 ml | 0.9 | 3.7 | 50 ml | 25 | above 1 |
| 8 | Tartaric acid/glyoxal | (1:1) | 7 | 1.2 | 1.8 | 50 ml | 0.9 | 3.7 | 50 ml | 25 | 0.5 |
| 9 | Comparison Gluconic acid | | | 1.2 | 1.8 | 50 ml | 0.9 | 3.7 | 50 ml | 25 | immediate precipitation |
| 10 | Comparison Quadrol | | | 1.2 | 1.8 | 50 ml | 0.9 | 3.7 | 50 ml | 25 | above 1 |

[1]Stability = time from coppering of the piece of circuitboard to the appearance of cloudiness and the precipitation of copper. Bath stored after coppering at 23° C.
[2]Mixing of bath = - separate preparation of solutions A and B. - initial introduction of A and addition of B with stirring.

ence of an acidic catalyst which process comprises depositing copper from said bath onto an object in said bath.

We claim:

1. A process for the chemical deposition of copper from an alkaline aqueous bath which contains a copper salt and a customary assistant and also as a complexing agent a polyacetal obtainable by reacting (a) a dialdehyde of the formula $$OHC-A_n-CHO$$

2. A process as claimed in claim 1, wherein the polyacetal used is obtainable by reacting glyoxal or glutardialdehyde with gluconic acid or glucoheptonic acid in a molar ratio of from 1:0.7 to 1:2.5.

3. A process as claimed in claim 1, wherein the polyacetal is used in an amount of from 10 to 40 g/l of bath liquid.

* * * * *